US007934634B2

(12) United States Patent
Mii et al.

(10) Patent No.: US 7,934,634 B2
(45) Date of Patent: May 3, 2011

(54) WIRE BONDING METHOD

(75) Inventors: Tatsunari Mii, Tachikawa (JP); Tishihiko Toyama, Tokorozawa (JP); Shinsuke Tei, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 12/384,643

(22) Filed: Apr. 7, 2009

(65) Prior Publication Data

US 2009/0194577 A1 Aug. 6, 2009

Related U.S. Application Data

(62) Division of application No. 11/347,479, filed on Feb. 3, 2006, now abandoned.

(30) Foreign Application Priority Data

Feb. 8, 2005 (JP) .................................. 2005-31701

(51) Int. Cl.
*B23K 31/02* (2006.01)

(52) U.S. Cl. ...................................... 228/180.5; 228/4.5

(58) Field of Classification Search ................... 228/4.5, 228/180.5

See application file for complete search history.

(56) References Cited

U.S. PATENT DOCUMENTS

| | | | | |
|---|---|---|---|---|
| 6,715,666 | B2 * | 4/2004 | Imai et al. | 228/180.5 |
| 2003/0155405 | A1 * | 8/2003 | Takahashi | 228/180.5 |
| 2004/0026480 | A1 | 2/2004 | Imai et al. | |
| 2004/0164127 | A1 | 8/2004 | Mii et al. | |
| 2004/0164128 | A1 | 8/2004 | Mii et al. | |
| 2005/0054186 | A1 | 3/2005 | Kim et al. | |
| 2005/0072833 | A1 * | 4/2005 | Wong et al. | 228/180.5 |
| 2005/0167473 | A1 * | 8/2005 | Mayer et al. | 228/180.5 |

FOREIGN PATENT DOCUMENTS

| | | |
|---|---|---|
| JP | 9-51011 | 2/1997 |
| JP | 2004-31451 | 1/2004 |
| JP | 2004-172477 | 6/2004 |
| JP | 2006-261448 | 9/2006 |

* cited by examiner

*Primary Examiner* — Jessica L Ward
*Assistant Examiner* — Nicholas P D'Aniello
(74) *Attorney, Agent, or Firm* — DLA Piper LLP (US)

(57) ABSTRACT

A wire bonding method with the process of performing a first bonding to a pad of a die that is a first bond point, and the process of performing a second bonding to an interconnect wiring (or a lead) that is a second bond point, thus connecting the pad and the interconnect wiring with a wire. A bump is first formed on a pad, and, in a wire cutting step performed during the step of forming the bump, the wire protruding from the tip end of a capillary is bent in the lateral direction to form a bent part, and then the bent part is bonded to the bump, thus completing the first bonding process; after which the wire is bonded to the interconnect wiring, thus completing the second bonding process.

4 Claims, 8 Drawing Sheets

WIRE BONDING METHOD

BACKGROUND OF THE INVENTION

The present invention relates to a wire bonding method and more particularly to a wire bonding method well suited to low-loop implementation.

In wire bonding methods for bonding a ball to a first bond point, the ball neck portion at a tip end of a bonding wire becomes a recrystallized area which is hard and brittle; accordingly, in order to form a wire loop, the wire must be bent from the portion above the recrystallized area. For that reason, it would not be able to respond to the desire for low-loop implementation.

Japanese Patent Application Laid-Open (Kokai) Nos. H9-51011 and 2004-172477 solve the above-described problems. The methods disclosed in these publications takes the following steps: a ball formed at the tip end of a wire is first bonded to a die pad to form a compression-bond ball; next, after raising the capillary, it is moved in a direction opposite from an interconnect wiring (or an outer lead of a lead frame); then, after raising the capillary, it is moved to directly above the pad; the capillary is next lowered, and the wire is pressure-bonded onto the pressure-bond ball; and then, the capillary is moved onto the interconnect wiring, bonding the wire to the interconnect wiring.

In these publications described above, the recrystallized area portion of the wire is bent and bonded onto a pressure-bond ball bonded to the pad; as a result, it would be able to lower the bonding height on the pad and to accomplish low-loop implementation. However, since it is necessary to superimpose wire, doubled, on the pressure-bond ball, there have been inherent limitations to low-loop implementation.

BRIEF SUMMARY OF THE INVENTION

The object of the present invention is to provide a wire bonding method that provides a further or improved low-loop implementation.

The above object is accomplished by a series of unique processes of the present invention for a wire bonding method that performs first bonding to a pad of a die (called "die pad" or merely "pad") that is a first bond point and then second bonding to an interconnect wiring that is a second bond point, thus connecting the die pad and interconnect wiring; and in the present invention, the method includes sequentially:

a bump forming process for forming a bump on a die pad, this bump forming process including a step of cutting and bending a wire protruding from a tip end of a capillary in a lateral direction thus forming a bent part in the wire;

a first bonding process for bonding the bent part of the wire to the bump; and a second bonding process for bonding the wire to the interconnect wiring.

The above object is accomplished by another series of unique processes of the present invention for a wire bonding method that performs first bonding to an interconnect wiring that is a first bond point and second bonding to a die pad that is a second bond point, thus connecting the interconnect wiring and die pad; and in the present invention, the method includes sequentially:

a bump forming process for forming a bump on a die pad, this bump forming process including a step of cutting and bending a wire protruding from a tip end of a capillary in a lateral direction thus forming a bent part in the wire;

a first bonding process for bonding the bent part of the wire to the interconnect wiring thus forming a lower first bonding part on the interconnect wiring, the first bonding process further raising and moving the capillary above the lower first bonding part then lowering the capillary and superimposing and connecting the wire onto the lower first bonding part thus forming an upper first bonding part on the lower first bonding; and a second bonding process for bonding the wire to the bump on the die pad.

In the above-described methods of the present invention, the bent part is formed by holding the wire with a clamper, and moving the clamper and capillary in the lateral direction, thus cutting the wire.

Furthermore, in the methods of the present invention the bent part can be formed by holding the wire with a clamper, and then moving the capillary and clamper parallel to the direction for joining the interconnect wiring and die pad and toward the interconnect wiring, thus cutting the wire.

Furthermore, in the methods of the present invention, the bump forming process comprises the ordered steps of:

bonding a ball formed at an end of the wire to the die pad, raising the capillary so that the edge at the lower end of the capillary is positioned within the height of a pillar portion formed on the bump, moving the capillary in the lateral direction thus forming a small thickness portion on a connected portion of the bump and wire, raising the capillary by a fixed amount, and pulling the wire by a clamper thus cutting the wire from the small thickness portion.

The bump forming process may include the ordered steps of:

bonding a ball formed at an end of the wire to the die pad, pressing the ball with the capillary to form a small thickness portion and a ball neck portion that can be teared off at the lower part thereof when the wire is pulled by a clamper, and pulling the wire by a clamper diagonally upward thus separating the ball neck portion from the small thickness portion.

As seen from the above, in the present invention, a bump is formed on a pad of a die ("die pad" or "pad") that is the first bond point; and, when a wire is cut from the bump, a bent part is formed in the wire protruding from the tip end of the capillary; as a result, when bonding is performed to the first bond point, the bent part is formed at the tip end of the wire without using a special apparatus and thus the bent part is formed by an existing wire bonding apparatus.

In addition, in the present invention, since the bent part is bonded directly to the bump, the loop height at the first bond point can be made lower, and low wire loop implementation is effected.

On the other hand in the present invention, the wire is bonded to the bump directly as a second bond point, the loop height at the second bond point can be made lower, and low wire loop implementation is effected. Furthermore, the bent part is bonded to the interconnect wiring that is the first bond point to first form a lower first bonding part, and then the wire is bent and superimposed onto that lower first bonding part to form an upper first bonding part. Accordingly, the reliability of the bonding strength to the interconnect wiring is significantly enhanced.

Furthermore, in the present invention, the bent part is formed, when cutting the wire from the bump, by moving the capillary parallel to the interconnect wiring and the bump to be connected next and then toward the interconnect wiring that is the second bond point; as a result, the direction of the bent part of the wire tip end can be bent in a direction suitable for the next bonding, and, in conjunction therewith, the shape of the wire loop for bonding that bent part to the interconnect wiring that is the second bond point, after bonding it to the bump, can be made lower. For this reason also, low wire loop implementation can be effected.

In the present invention, since the upper surface of the bump is flat, the wire connected to this bump can be substantially horizontal, and low wire loop implementation is effected.

In the present invention, the ball is mashed when forming the bump until the thickness is such that tearing-off occurs from the lower part of the ball neck portion when the wire is pulled; accordingly, the bump height is extremely low, the loop height on the pad can be made even lower, and further low wire loop implementation is effected.

DETAILED DESCRIPTION OF THE INVENTION

Figure 1:
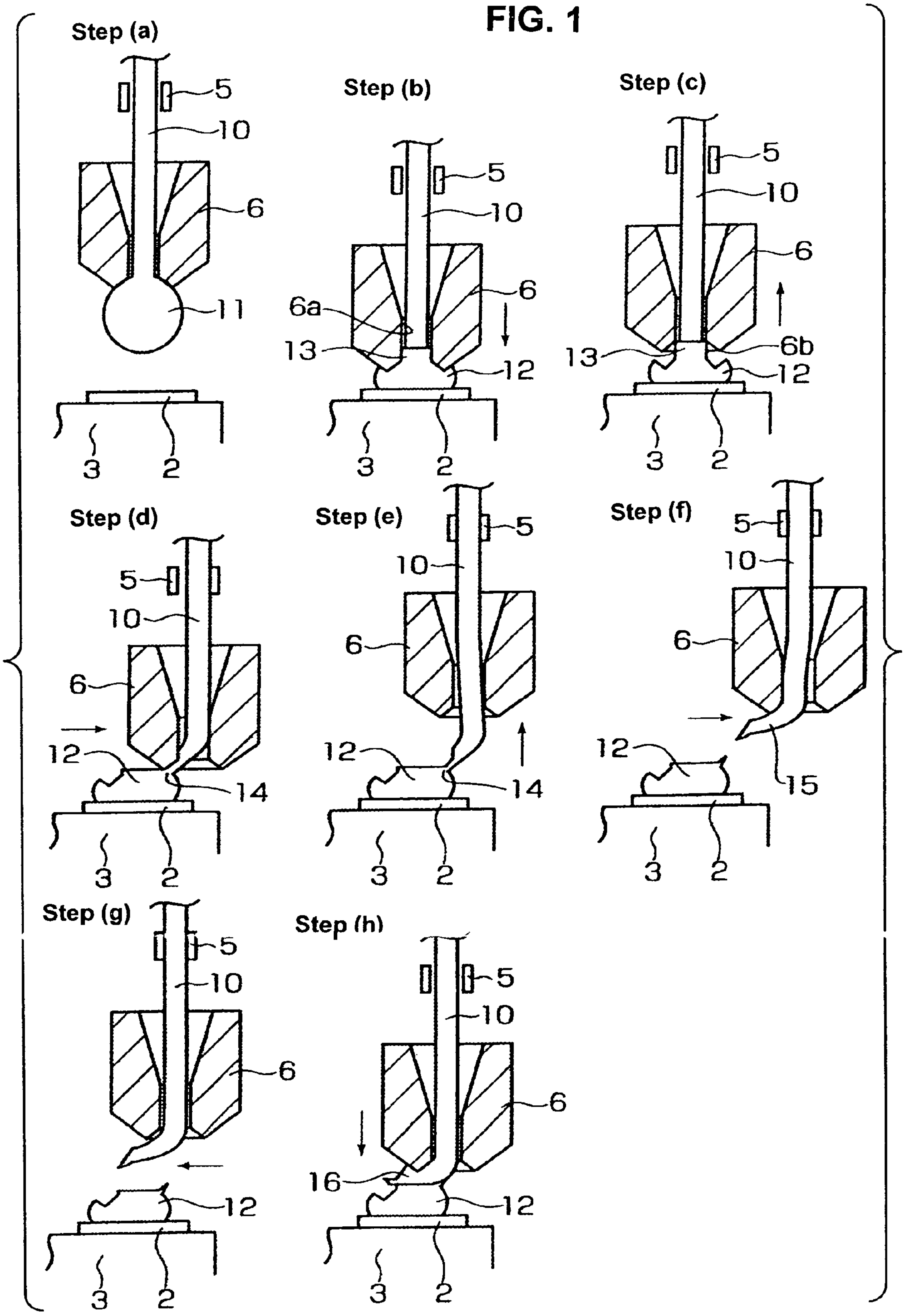
FIG. 1 shows steps according to a first embodiment of the wire bonding method of the present invention.

A first embodiment of the wire bonding method of the present invention is described with reference to FIG. 1 and FIG. 2. As shown in FIG. 2, a die 3 on which a pad 2 of a die (or "die pad") is formed is mounted on a circuit board 1 comprising a ceramic substrate or print board or lead frame or the like. An interconnect wiring (or an outer lead or conductive pathways) 4 is formed on the circuit board 1.

First, in step (a), a ball 11 is formed by an electric torch (not shown in the drawing) at the tip end of a wire 10 passed through a clamper 5 and inserted through a capillary 6, after which the clamper 5 is in an open condition.

Next, in step (b), the capillary 6 descends (or lowered) and bonds the ball 11 to the pad 2 that is the first bond point. Thereby, a portion of the ball 11 bulges up into the through-hole 6*a* in the capillary 6, and a pillar portion 13 is formed on a bump 12.

Following the step (b), in step (c), the capillary 6 is raised so that the edge 6*b* at the lower end of the capillary 6 is positioned within the height of the pillar portion 13.

Next, in step (d), the clamper 5 and capillary 6 are moved together in a direction toward the interconnect wiring 4 side that is the second bond point, and a small thickness portion 14 is formed at the connection between the bump 12 and the wire 10.

In the next step (e), the clamper 5 closes, and the clamper 5 and capillary 6 ascend (or raised) together by a fixed amount.

Then, in step (f), the clamper 5 and capillary 6 move together to the side of the interconnect wiring 4 that is the second bond point. Thereby, the wire 10 is cut from the small thickness portion 14, and the bump 12 is formed on the pad 2. Also, at the tip end of the wire 10 protruding from the lower end of the capillary 6, a bent part 15 is formed which is bent in a direction toward the bump 12 side. The bump forming process is thus completed.

Next, in step (g), the bent part 15 is moved so as to be positioned above the bump 12.

Then, in step (h), after the clamper opens, the capillary 6 descends, bonds the bent part 15 to the bump 12, and forms the first bonding part 16. Also, the clamper 5 is brought in an open condition, completing the first bonding process.

After the step (h), the wire 10 is connected to the interconnect wiring 4 that is the second bond point (as seen conventionally).

More specifically, as shown in FIG. 2, the capillary 6 ascends in step (a), and, in step (b), the capillary 6 moves toward the interconnect wiring 4 and pays out the wire 10, and then descends, bonds the wire 10 to the interconnect wiring 4, and makes that the second bonding part 17. Next, in step (c), the clamper 5 and capillary 6 ascend together, during which ascension the clamper 5 closes, and the wire 10 is cut from the base of the second bonding part 17, completing the second bonding process.

As seen from above, because the bump 12 is formed on the pad 2 that is the first bond point, and the bent part 15 is formed in the wire protruding at the tip end of the capillary 6 when the wire 10 is cut from that bump 12, the bent part 15 at the tip end of the wire can be formed by an existing wire bonding apparatus when bonding is made for the first bond point without providing a special apparatus. Moreover, because the bent part 15 is bonded directly to the bump 12, the first bond point loop height can be lowered. More specifically, low wire loop implementation is effected. Also, the above-described bent part 15 is formed by moving the capillary 6 both in parallel with the bump 12 and interconnect wiring 4 that are connected next when cutting the wire 10 from the bump 12, and to the side of the interconnect wiring 4 that is the second bond point. Thereby, the direction of the bent part 15 at the tip end of the wire can be bent in a direction suitable for the next bonding while, at the same time, after bonding that bent part 15 to the bump 12, the shape of the wire loop for bonding to the interconnect wiring 4 that is the second bond point can be made lower. For this reason also, low wire loop implementation can be effected.

With the bump 12, moreover, after the ball 11 is bonded to the pad 2, the capillary 6 is raised so that the edge 6*b* at the lower end of the capillary 6 is positioned within the height of the pillar portion 13 formed on the bump 12, next the capillary 6 is moved in a lateral direction and the small thickness portion 14 is formed at the connection between the bump 12 and the wire 10, and then, after raising the capillary 6 by a fixed amount, the wire 10 is pulled and cut from the small thickness portion 14, whereupon the upper surface of the bump 12 becomes flat; as a result, the interconnect wiring direction for the wire 10 connected to that bump 12 becomes substantially horizontal, and low wire loop implementation is effected.

Figure 2:
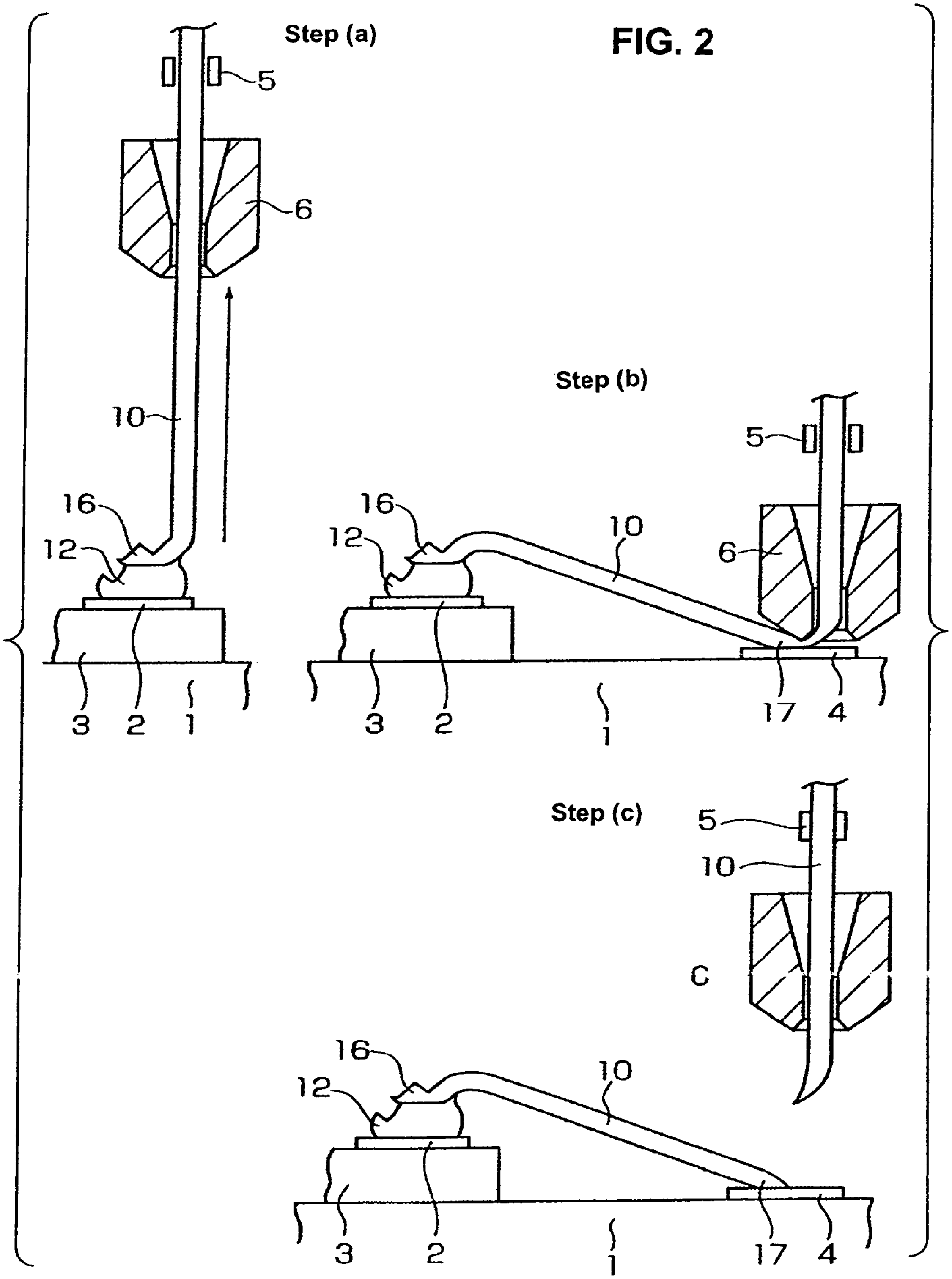
FIG. 2 shows further steps that continue on from step (h) of FIG. 1.
Figure 3:
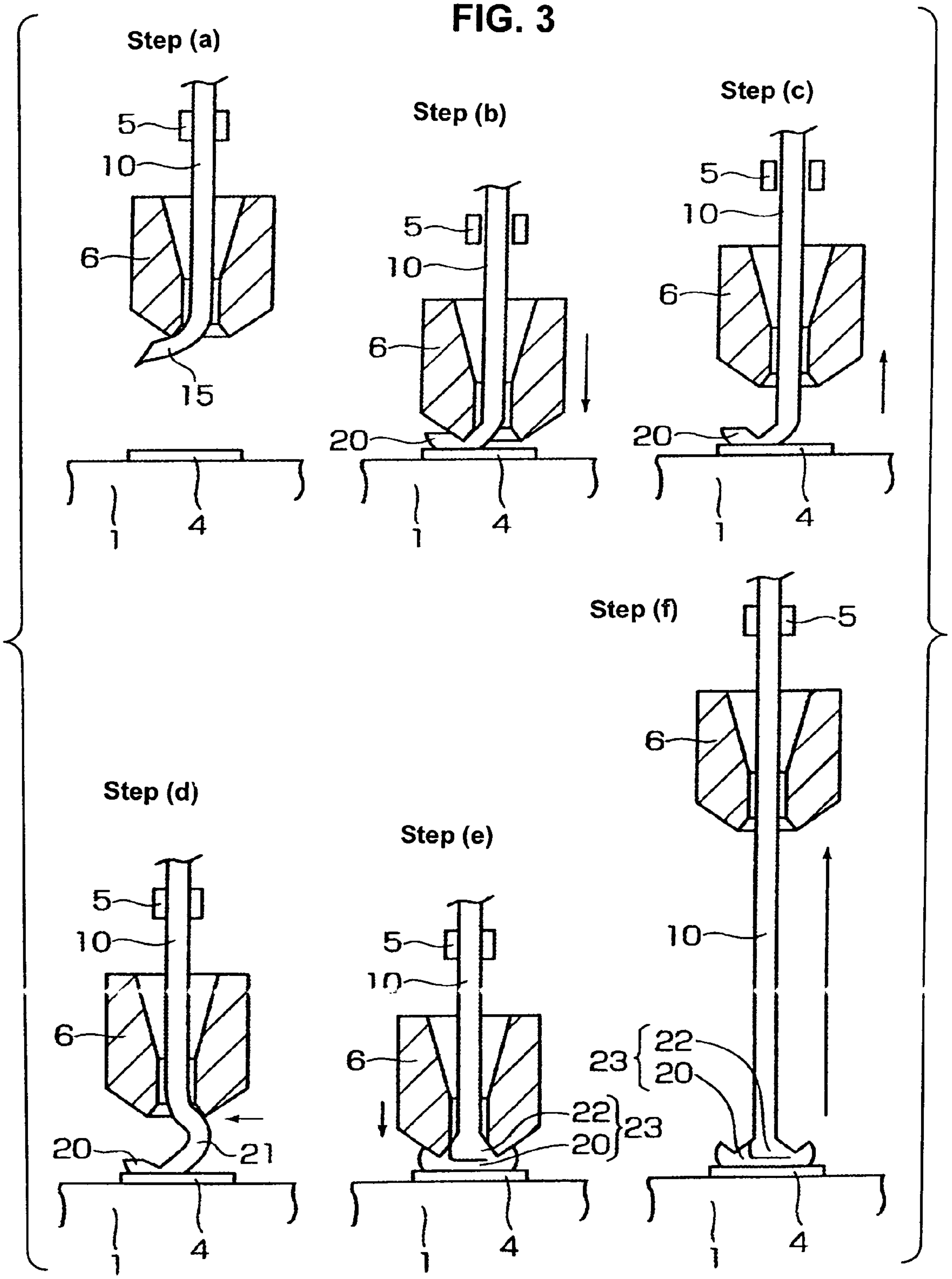
FIG. 3 shows steps according to a second embodiment of the wire bonding method of the present invention, step (a) of FIG. 3 continuing on from step (f) of FIG. 1.
Figure 4:
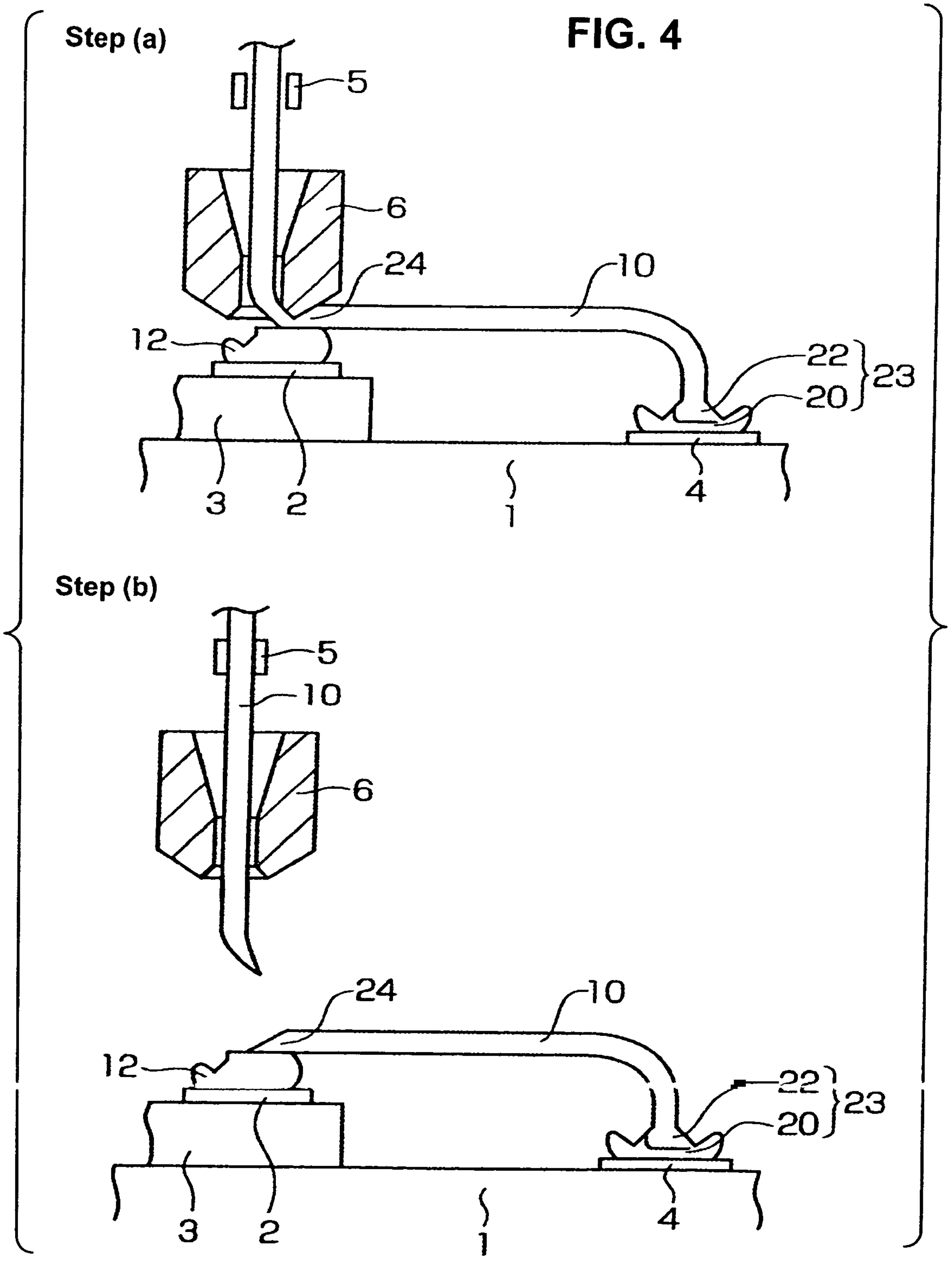
FIG. 4 shows further steps that continue on from the step (f) of FIG. 3.

A second embodiment of the wire bonding method of the present invention is described in FIG. 1, FIG. 3, and FIG. 4. This embodiment, in addition to being such that the bump 12 is formed on the pad 2 in steps (a) to (f) in FIG. 1, is the same as the above-described embodiment up to the formation of the bent part 15 that is bent in the direction on the side of the bump 12 at the lower surface of the capillary 6. In the next step, the bent part 15 is bonded onto the interconnect wiring 4 (though in the previous embodiment the bent part 15 is bonded onto the bump 12). More specifically, though in the first embodiment, the pad 2 is the first bond point and the interconnect wiring 4 is the second bond point, in the second embodiment, conversely, the interconnect wiring 4 is the first bond point and the pad 2 is the second bond point.

In the second embodiment, after the step (f) shown in FIG. 1 where the bump forming process is completed, the capillary 6 is moved upward from the interconnect wiring 4 in step (a) of FIG. 3.

Next, in step (b), the clamper 5 closes, the capillary 6 descends, bonds the bent part 15 to the interconnect wiring 4 that is the first bond point, and forms a lower first bonding part 20. Also, the clamper 5 is brought in an open condition.

Next, in step (c), the capillary 6 is raised, and then is moved above the lower first bonding part 20 in step (d).

In the next step (e), the clamper closes, the capillary 6 is lowered, the wire portion 21 shown in the illustration for step (d) is bent, and the wire portion 21 is bonded onto the lower part first bond point, forming an upper first bonding part 22, thus making it a first bonding part 23 and completing the first bonding process.

After the step (e), the wire 10 is connected onto the bump 12 formed on the pad 2 that is the second bond point. In other words, in step (f), the capillary 6 ascends, and it moves toward the pad 2 in step (a) of FIG. 4, paying out the wire 10, and then descends, bonds the wire 10 to the bump 12, and makes it a second bonding part 24.

Next, in step (b) of FIG. 4, the clamper 5 and capillary 6 ascend together, the clamper 5 closes during that ascension, and the wire 10 is cut from the base of the second bonding part 24, thus completing the second bonding process.

In this embodiment, the first bond point has become the interconnect wiring 4. The bonding strength will be weak if the bent part 15 is bonded only to the interconnect wiring 4. In this embodiment, the bent part 15 is bonded to the first bond point to first form the lower first bonding part 20, and then the wire portion 21 is bent and superimposed on that lower first bonding part 20 to form the upper first bonding part 22. As a result, the reliability of the bonding strength to the first bond point is significantly enhanced. Also, because the bump 12 is formed on the pad 2, and the wire 10 is bonded directly to that bump 12 as the second bond point, the loop height on the pad 2 side becomes lower. In other words, low wire loop implementation is effected. Also, because the bump 12 is formed on the pad 2 that is the second bond point, and the protruding wire bent part 15 is formed at the tip end of the capillary 6 when the wire 10 is cut from that bump 12, the bent part 15 at the wire tip end can be formed by an existing wire bonding apparatus, without providing a special apparatus, when bonding is made for the first bond point.

Figure 5:
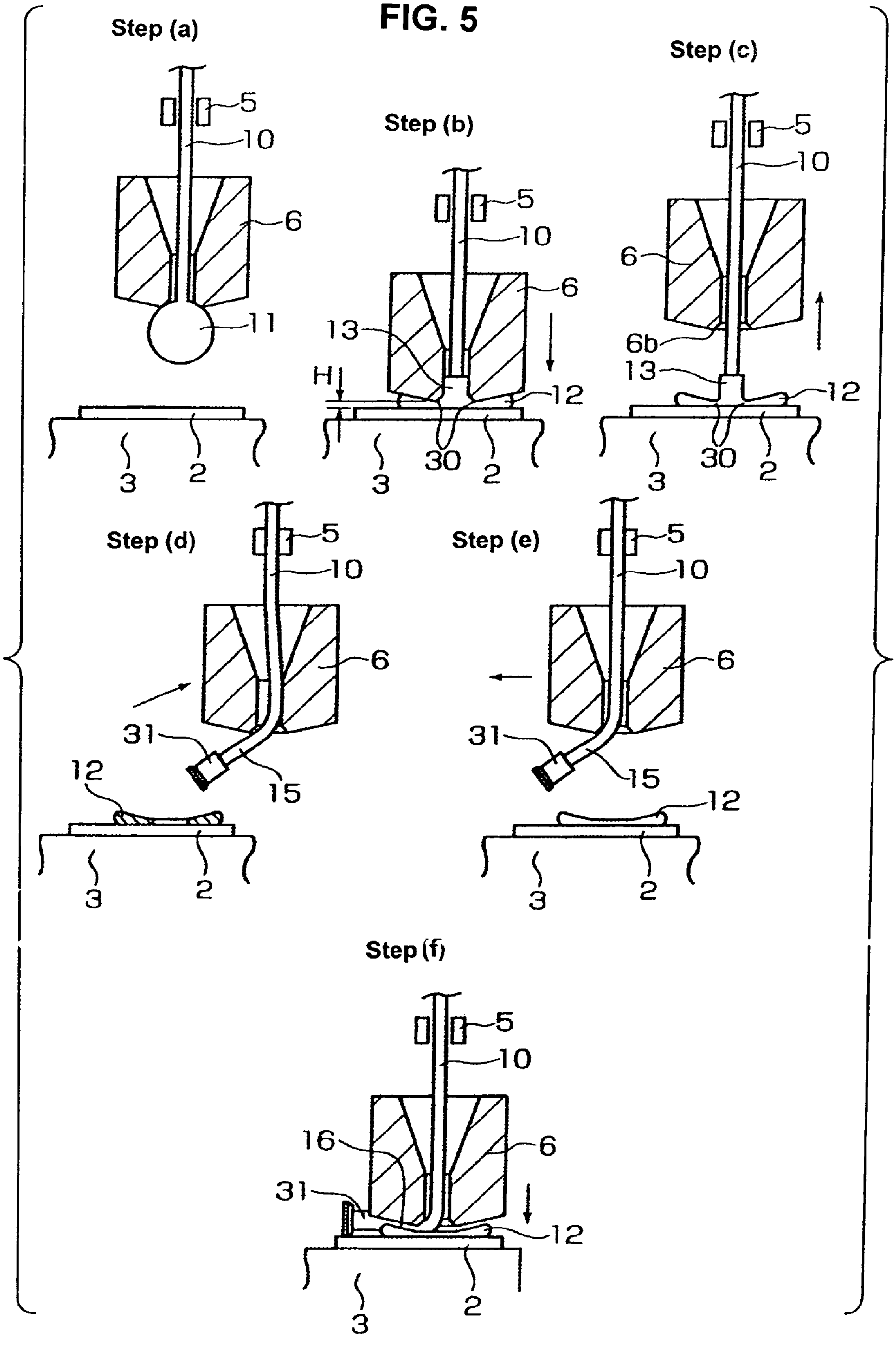
FIG. 5 shows steps according to a third embodiment of the wire bonding method of the present invention.
Figure 6:
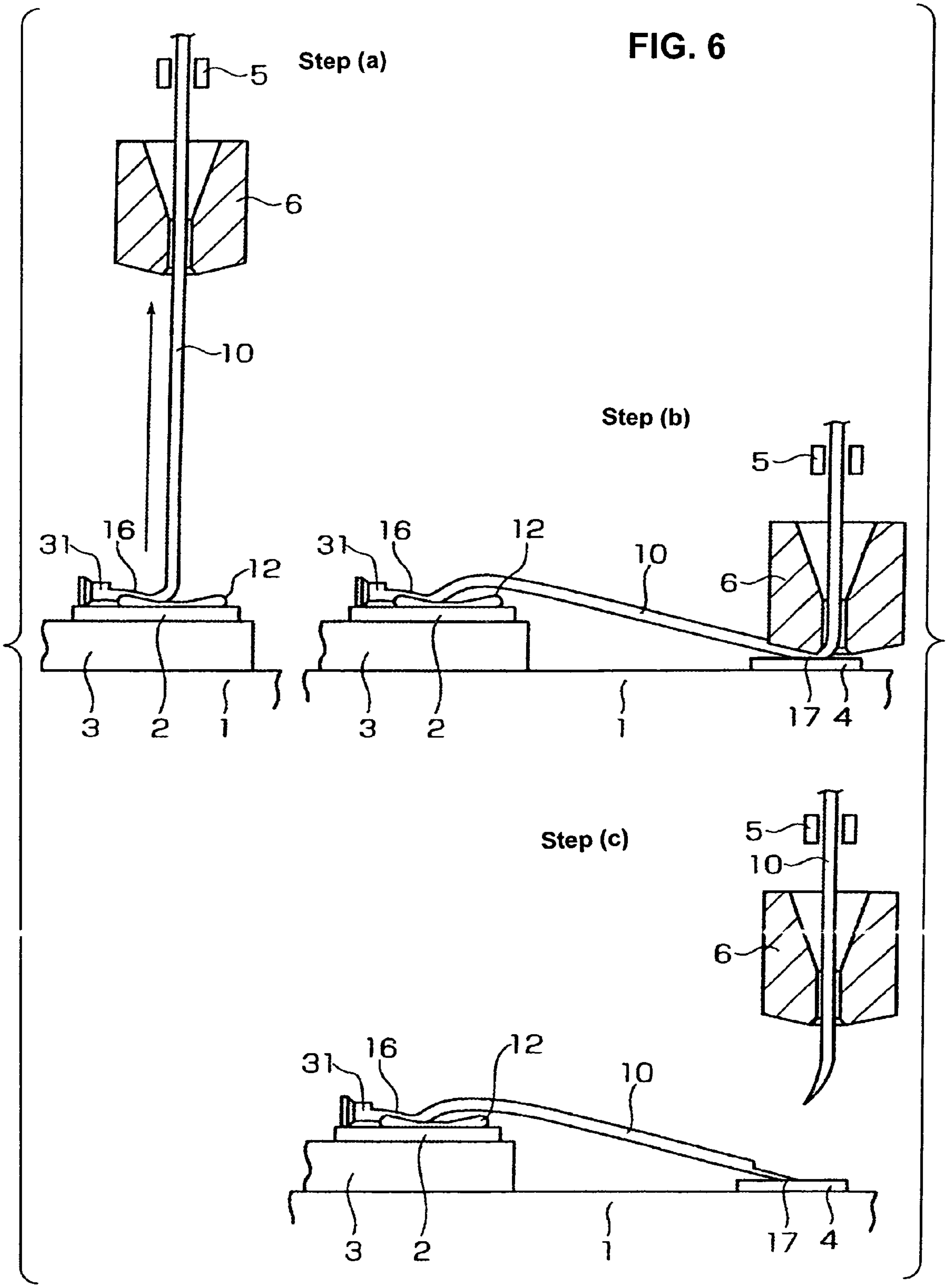
FIG. 6 shows further steps that continue on from step (f) of FIG. 5.

A third embodiment of the wire bonding method of the present invention is described in FIG. 5 and FIG. 6. Members that are the same as or correspond to those in the above-described embodiments are described in designating them with the same symbol. This third embodiment differs from the above-described first embodiment only in the method of forming the bump 12.

First, in step (a) of FIG. 5, the ball 11 is formed by an electric torch (not shown in the drawing) at the tip end of the wire 10 passed through the clamper 5 and inserted through the capillary 6, after which the clamper 5 is in an open condition.

Next, in step (b), the capillary 6 descends and bonds the ball 11 to the pad 2 that is the first bond point. This differs from the above-described embodiment in that the ball 11 is mashed to the limit. For example, the ball 11 is mashed until the height H of the lower part of the ball neck portion becomes 0 to 5 μm or so (thickness at which the wire 10 will tear off from the lower part of the ball neck portion when it is pulled diagonally upward). Thereby, the height H of the lower part of the ball neck portion will be the thickness of the small thickness portion 30.

In the next (c), the clamper 5 and capillary 6 are raised by a fixed amount so that the edge **6*b* at the lower end of the capillary 6 is positioned higher than the height of the pillar portion 13**.

In the next step (d), the clamper 5 closes and, and the clamper 5 and capillary 6 move together diagonally upward on the side of the interconnect wiring 4 that is the second bond point. As a result, the wire 10 is cut from the small thickness portion 30 of the lower part of the ball neck portion, and the bump 12 is formed on the pad 2. Also, the tip end of the wire 10 protruding from the lower end of the capillary 6 is formed as the bent part 15 which is bent toward the bump 12 side, and a ball neck portion 31 is formed at the tip end of that bent part 15.

After the step (d), the same steps as steps (g) and 1(*h*) shown in FIG. 1 are performed. In other words, in step (e) of FIG. 5, the clamper closes, the bent part 15 of the wire is moved so as to be positioned above the bump 12. Then, in step (f), the clamper opens, the capillary 6 descends, bonding the bent part 15 to the bump 12, thus forming the first bonding part 16. Also, the clamper 5 is brought in an open condition.

Thereafter, the wire 10 is connected to the interconnect wiring 4 that is the second bond point as conventionally. More specifically, in step (a) shown in FIG. 6, the capillary 6 ascends, moves in step (b) toward the interconnect wiring 4 and pays out the wire 10, then descends and bonds the wire 10 to the interconnect wiring 4, making it the second bonding part 17. Next, in step (c), the clamper 5 and capillary 6 ascend together, the clamper 5 closes during that ascension, and the wire 10 is curt from the base of the second bonding part 17.

The same benefits are realized in this third embodiment as in the above-described first embodiment. With this third embodiment, in particular, the ball 11 is mashed during the formation of the bump 12 until the thickness thereof becomes such that it will tear away from the lower part of the ball neck portion when the wire 10 is pulled; as a result, the height of the bump 12 is made extremely low. For that reason, in the method of the third embodiment, the loop height on the pad 2 can be made lower, and greater low wire loop implementation is effected, than with the above-described first embodiment.

Figure 7:
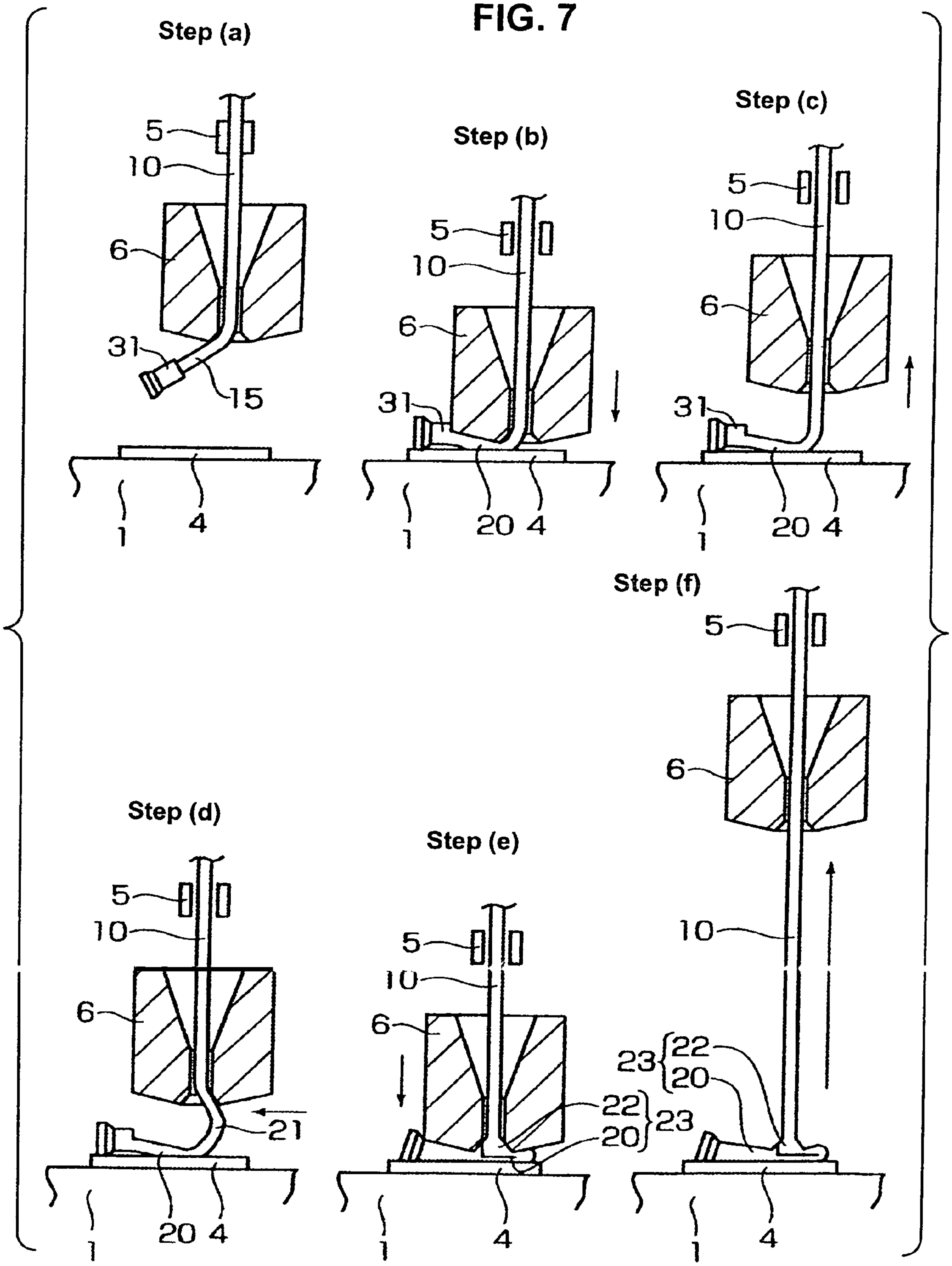
FIG. 7 shows steps according to a fourth embodiment of the wire bonding method of the present invention, step (a) of FIG. 7 continuing on from step (d) of FIG. 5.
Figure 8:
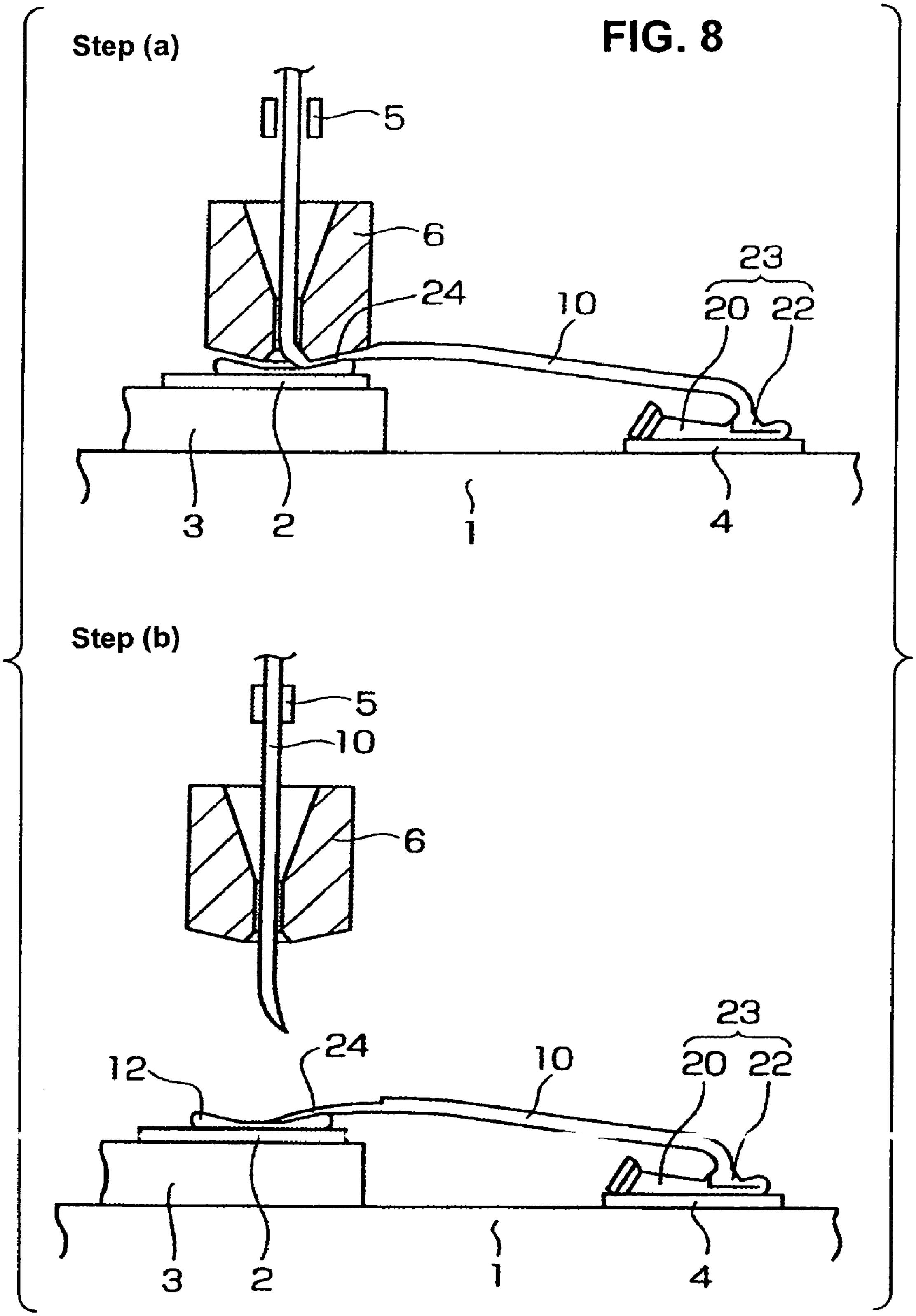
FIG. 8 shows further steps that continue on from step (f) of FIG. 7.

A fourth embodiment of the wire bonding method of the present invention is performed with steps (a) to (d) in FIG. 5 and steps of FIGS. 7 and 8. The fourth embodiment, in addition to being such that the bump 12 is formed on the pad 2 in the steps (a) to (d) shown in FIG. 5, is the same as the above-described embodiment up to the formation of the ball neck portion 31 and the bent part 15 that is bent in the direction on the side of the bump 12 at the lower surface of the capillary 6. After that, the same processes as those for the second embodiment (see FIGS. 3 and 4) are performed.

More specifically, in the fourth embodiment, after the step (d) of FIG. 5, the clamper 5 opens, and the capillary 6 is moved in step (a) shown in FIG. 7 to above the interconnect wiring 4.

Then, in step (b), the capillary 6 descends, bonds the bent part 15 to the interconnect wiring 4 that is the first bond point, and forms the lower first bonding part 20.

Next, in step (c), the capillary 6 is raised, and in step (d), the capillary 6 is moved above the lower first bonding part 20.

In the next step (e), the capillary 6 is lowered, the wire portion 21 show in the illustration for step (d) is bent, the wire portion 21 is bonded onto the lower first bonding part 20, whereupon the upper first bonding part 22 is formed, and that is made the first bonding part 23.

After the step (d), the wire 10 is connected onto the bump 12 formed on the pad 2 that is the second bond point. More specifically, in step (f) shown in FIG. 7, the capillary 6 ascends and moves in step (a) shown in FIG. 8 toward the pad 2 and pays out the wire 10, then it descends and bonds the wire 10 to the bump 12, making it the second bonding part 24. Next, in step (b), the clamper 5 and capillary 6 ascend together, the clamper 5 closes during that ascension, and the wire 10 is cut from the base of the second bonding part 24.

The method described above provides the same effects as those by the above-described second embodiment. In this fourth embodiment, the ball 11 is, as in the third embodiment, crushed during the formation of the bump 12 until the thickness thereof becomes such that it will tear away from the lower part of the ball neck portion when the wire 10 is pulled. As a result, the height of the bump 12 can be made extremely low. For this reason, in this fourth embodiment, the loop height on the pad 2 can further be lowered, and greater low wire loop implementation is effected than the second embodiment.

Furthermore, in the second and fourth embodiments, the bent part 15 is the lower first bonding part 20, and the upper first bonding part 22 is on the lower first bonding part 20. As a result, the direction of bending in the bent part 15 need not be toward the second bond point, it can be in any direction.

The invention claimed is:

1. A wire bonding method of bonding a wire from a first bonding point to a second bonding point, the method comprising, in the order stated, the steps of:

a bump forming step of forming a bump on a die pad;

wherein the first bonding point is an interconnect wiring and the second bonding point is the bump formed on the die pad;

a bent portion forming step of forming a bent portion in a portion of the wire that protrudes from a tip end of a capillary by holding the wire with a clamper and bending the portion of the wire protruding from the tip end of the capillary in a direction parallel to a line joining the first and second bonding points and towards edges of a die, thereby cutting the wire from the bump;

a first bonding step of bonding the bent portion directly on the first bonding point;

a looping step of looping the wire between the first bonding point and the second bonding point;

a second bonding step of bonding the wire on the second bonding point;

a cutting step of cutting the wire from the second bonding point; and wherein the first bonding step further comprises, in the order stated, the steps of:

a lower first bonding portion forming step of forming the lower first bonding portion on the interconnect wiring by bonding the bent portion of the wire; and an upper first bonding portion forming step of raising and moving the capillary above the lower first bonding portion then lowering the capillary to the lower first bonding portion.

2. The wire bonding method according to claim 1, further comprising:

at least one additional upper first bonding portion forming step of raising and moving the capillary above the upper first bonding portion then lowering the capillary.

3. A method of bonding a wire to a first bonding point and a second bonding point, the method comprising the steps of:

forming a bump to a die pad serving as the second bonding point;

forming a bent portion in a portion of the wire that protrudes from a tip end of a capillary by holding the wire with a clamper and bending the portion of the wire protruding from the tip end of the capillary in a direction parallel to a line joining the first and second bonding points and toward edges of a die, thereby tearing off the wire from the bump;

bonding the bent portion directly to an interconnect wiring serving as the first bonding point by descending the capillary while opening the wire with the clamper, thereby forming a lower first bonding portion;

paying out the wire from the capillary while raising and moving the capillary above the lower first bonding portion;

bonding the wire that extends from the capillary to the lower first bonding portion, thereby forming an upper first bonding portion;

looping the wire from the upper first bonding portion to the bump;

bonding the wire to the bump; and tearing off the wire that extends from the bump by pulling the capillary while holding the wire with the clamper, thereby completing a wire loop to the first and second bonding points.

4. The method according to claim 3, wherein, after forming the upper first bonding portion, the capillary is raised and moved above the upper first bonding point several times and then the capillary is lowered to the upper first bonding point, thereby forming at least one additional upper first bonding portion.

* * * * *

UNITED STATES PATENT AND TRADEMARK OFFICE

CERTIFICATE OF CORRECTION

PATENT NO. : 7,934,634 B2
APPLICATION NO. : 12/384643
DATED : May 3, 2011
INVENTOR(S) : Tatsunari Mii et al.

It is certified that error appears in the above-identified patent and that said Letters Patent is hereby corrected as shown below:

Item (75) Inventors:

Change "Tatsunari Mii, Tachikawa (JP); Tishihiko Toyama, Tokorozawa (JP); Shinsuke Tei, Musashimurayama (JP)" to --Tatsunari Mii, Tachikawa (JP); Toshihiko Toyama, Tokorozawa (JP); Shinsuke Tei, Musashimurayama (JP)--

Signed and Sealed this
Tenth Day of January, 2012

David J. Kappos

David J. Kappos
*Director of the United States Patent and Trademark Office*